US007768285B2

(12) United States Patent
Sanada et al.

(10) Patent No.: US 7,768,285 B2
(45) Date of Patent: Aug. 3, 2010

(54) PROBE CARD FOR SEMICONDUCTOR IC TEST AND METHOD OF MANUFACTURING THE SAME

(75) Inventors: Minoru Sanada, Osaka (JP); Yoshirou Nakata, Kyoto (JP)

(73) Assignee: Panasonic Corporation, Osaka (JP)

( * ) Notice: Subject to any disclaimer, the term of this patent is extended or adjusted under 35 U.S.C. 154(b) by 212 days.

(21) Appl. No.: 11/812,463

(22) Filed: Jun. 19, 2007

(65) Prior Publication Data

US 2008/0150563 A1    Jun. 26, 2008

(30) Foreign Application Priority Data

Jul. 28, 2006  (JP)  .............. 2006-205462

(51) Int. Cl.
G01R 31/02   (2006.01)
G01R 31/26   (2006.01)

(52) U.S. Cl. .................. 324/758; 324/754; 324/760; 324/765

(58) Field of Classification Search .......... 324/754, 324/758, 760, 765
See application file for complete search history.

(56) References Cited

U.S. PATENT DOCUMENTS 5,124,639 A * 6/1992 Carlin et al. ............... 324/760
5,325,052 A * 6/1994 Yamashita .................. 324/754
5,990,695 A * 11/1999 Daugherty, Jr. ............. 324/758
6,323,663 B1 * 11/2001 Nakata et al. ............... 324/754
2004/0032272 A1 * 2/2004 Maruyama et al. .......... 324/754

FOREIGN PATENT DOCUMENTS

JP         7-231019      8/1995
JP         2005-340485   12/2005

* cited by examiner

Primary Examiner—Ha Tran T Nguyen
Assistant Examiner—Karen M Kusumakar
(74) Attorney, Agent, or Firm—Steptoe & Johnson LLP

(57) ABSTRACT

Provided is a probe card for semiconductor IC test on one principal surface of which are formed a plurality of probe electrodes, such as bump electrodes (5), and which has, in a peripheral portion thereof, a thin film sheet (9) fixed to a support, such as a ceramics ring (7). A local tension-changed portion (12) is formed in the thin film sheet (9) fixed to the ceramics ring (7) so that a tensile strain is generated, and the plurality of bump electrodes (5) are arranged in prescribed positions that connect electrically to electrodes of each semiconductor IC element of the semiconductor wafer. The tensile strain of the thin film sheet (9) is changed positively and in a sustained manner, whereby the bump electrodes (5) are rearranged in desired positions.

14 Claims, 12 Drawing Sheets

PROBE CARD FOR SEMICONDUCTOR IC TEST AND METHOD OF MANUFACTURING THE SAME

FIELD OF THE INVENTION

The present invention relates to a probe card for semiconductor IC test for wafer level-inspecting and screening a plurality of semiconductor IC elements formed on a semiconductor wafer in the wafer state, and a method of manufacturing the same.

BACKGROUND OF THE INVENTION

Usually, a plurality of semiconductor IC elements are formed on a semiconductor wafer after the diffusion process and divided into individual semiconductor devices. The divided semiconductor devices are, for example, electrically connected to a lead frame using bonding wires and molded with resins, ceramics and the like to yield products.

With the scale down of the fabrication process and multifunctional designs of semiconductor IC elements advancing, the burn-in (screening) test has become indispensable for assuring the quality of products and for preventing troubles after packaging. The burn-in test, which involves applying temperature and electrical loads to semiconductor IC elements, has hitherto been carried out in the state of products. However, the mode of sales in which semiconductor IC elements are sold as separate devices (chips) has become widespread and the quality assurance in the wafer state has become important. Therefore, the burn-in test in the wafer state has also been carried out. In wafer level burn-in, defects ascribed to the process can be detected before assembling and the inspection time in a succeeding step can be shortened. In addition, the burn-in cost can be reduced. Therefore, an improvement in productivity and an inspection cost reduction can be achieved.

In order to carry out wafer level burn-in, it is necessary to apply electric power from a power supply together to electrodes (AL pads) necessary for the burn-in inspection of each of a plurality of semiconductor IC elements on a semiconductor wafer. This means that in the case of a large-diameter wafer of 300 mm, full contact with as many as 70,000 electrodes or more is necessary. For this reason, a probe card capable of full contact with a large number of electrodes on the wafer, i.e., a medium in which a large number of probe electrodes are arranged so as to be opposed to the many electrodes distributed on the whole wafer surface has been proposed and used. Refer to Japanese Patent Laid-Open No. 7-231019, for example.

Because a probe card is intended to come into simultaneous contact with the many electrodes distributed on the whole wafer surface as descried above, the probe electrodes are required to have very high positional accuracy. However, with the diameter of wafers becoming larger, it becomes more difficult than ever to pursue the positional accuracy of the probe electrodes. In order to improve the positional accuracy, there have been proposed methods that involve temporarily applying tension to the outside or inside of a contact sheet on which probe electrodes are formed and fixing this state by a separate rigid ring or correction jig, whereby prescribed positional accuracy can be obtained. Refer to Japanese Patent Laid-Open No. 2005-340485, for example.

A representative construction of a probe card is shown in FIG. 13. Reference numeral 31 denotes a semiconductor wafer, which has a plurality of pad electrodes (hereinafter referred to simply as electrodes) 32. A probe card 1 is constituted by a contact sheet 2, a localized anisotropic conducting rubber 3 and a glass substrate 4. The contact sheet 2 is such that on one surface thereof are formed bump electrodes 5 as probe electrodes for coming into simultaneous contact with the plurality of electrodes 32 on the semiconductor wafer 31 and on the rear surface thereof are formed isolated-pattern electrodes 6 so as to form pairs with each of the bump electrodes 5. These isolated-pattern electrodes 6 are connected to the electrodes of the glass substrate 4 via the localized anisotropic conducting rubber 3.

A method of manufacturing the contact sheet 2 is shown in FIG. 14. First, as shown in FIGS. 14A and 14B, a two-layer base material 10 formed from a Cu layer 8 and a polyimide layer 9 is stuck to a ceramics ring 7 having a small coefficient of thermal expansion. On that occasion, the two-layer base material 10 is caused to expand thermally by being heated to the order of 200° C., and is stuck to the ceramics ring 7.

Next, as shown in FIG. 14C, holes 11 for forming bumps are formed on the two-layer base material 10 by a laser, as shown in FIG. 14D, bump electrodes 5 are formed by coating growth at the locations of the holes 11, and as shown in FIG. 14E, the Cu layer 8 is removed with a prescribed size thereof left behind as isolated-pattern electrodes 6 (for details, refer to Japanese Patent Laid-Open No. 7-231019, for example).

FIG. 14F shows a completed contact sheet 2. In this contact sheet 2, the bump electrodes 5 and the isolated-pattern electrodes 6 (refer to FIG. 14E) are formed on the front and rear sides of the polyimide layer 9 (hereinafter referred to as the thin film sheet 9). The peripheral portion of the contact sheet 2 (the thin film sheet 9 with bumps) is fixed to the ceramics ring 7. The reason why the two layer base material 10 was caused to expand thermally in sticking thereof to the ceramics ring 7 in advance is that the thin film sheet 9 remaining after the removal of the Cu layer 8 (the coefficient of thermal expansion of Cu is 16 ppm/° C.) is caused to have a given tension so that looseness does not occur even when the temperature of the base material sheet 10 is raised to a burn-in temperature.

With the construction of the conventional probe card 1, however, when the two layer base material 10 is stuck to the ceramics ring 7 as described above, the ceramics ring 7 receives a large force inward due to the tension of Cu and the ceramics ring 7 contracts isotropically due to this force and simultaneously strains elliptically. The amount of strain generated on this occasion is as large as not less than 10 times the amount of contraction. Because the direction of strain is determined by small variations occurring when the ceramics ring 7 and the two-layer base material 10 are manufactured, it is very difficult to predict the direction of strain for the bump electrodes 5 of the two-layer base material. For this reason, it is substantially impossible to ensure accuracy above the variations in elliptical strain, which are difficult to predict, no matter how the accuracy of the hole 11 formed in the two-layer base material 10 is increased.

Local, small deviations occur also in the hole 11 itself due to the effect of the heat that the two-layer base material 10 receives from laser light, that is, due to the effect of the order of working, working time and the working environment. These deviations are also very difficult to control, and provide a factor responsible for impairing the positional accuracy of the bump electrode 5 formed for each hole 11.

In the method of Japanese Patent Laid-Open No. 2005-340485, as described above, a correction is made by temporarily applying tension to the outside or inside of the contact sheet 2. However, this method has problems including the problem that it is necessary to secure beforehand a region necessary for making corrections.

DISCLOSURE OF THE INVENTION

In view of the above-described problem, an object of the present invention is to improve the accuracy of the positions of probe electrode, such as bump electrodes of a probe card.

To achieve the above-described problem, in the present invention, the tensile strain of a thin film sheet on which probe electrodes are formed is changed positively and in a sustained manner, whereby the probe electrodes are rearranged in desired positions and the accuracy of the positions of probe electrodes is improved.

That is, the present invention provides a probe card for semiconductor IC test on one principal surface of which are formed a plurality of probe electrodes for causing, together, a plurality of semiconductor IC elements formed on a semiconductor wafer to conduct electrically and which has, in a peripheral portion thereof, a thin film sheet fixed to a support. In this probe card for semiconductor IC test, a local tension-changed portion is formed in the thin film sheet fixed to the support so that a tensile strain is generated and the plurality of probe electrodes are arranged in prescribed positions that connect electrically to electrodes of each semiconductor IC of the semiconductor wafer.

Also the present invention provides a probe card for semiconductor IC test on one principal surface of which are formed a plurality of probe electrodes for causing, together, a plurality of semiconductor IC elements formed on a semiconductor wafer to conduct electrically and which has, in a peripheral portion thereof, a thin film sheet fixed to a support in a condition with tension. In this probe card for semiconductor IC test, the support to which the thin film sheet is fixed is in ring form, the support being fixed to a substrate having rigidity by being given a strain in at least one direction of the plane direction of the support, and the plurality of probe electrodes of the thin film sheet are arranged in prescribed positions that connect electrically to electrodes of each semiconductor IC element of the semiconductor wafer.

Also the present invention provides a method of manufacturing a probe card for semiconductor IC test on one principal surface of which are formed a plurality of probe electrodes for causing, together, a plurality of semiconductor IC elements formed on a semiconductor wafer to conduct electrically and which has, in a peripheral portion thereof, a thin film sheet fixed to a support. In this method, a local tension-changed portion where a tensile strain is generated in the thin film sheet fixed to a frame-like support, which is the same as the support or different therefrom, in at least one location, whereby positions of the plurality of probe electrodes of the thin film sheet are corrected to prescribed positions that connect electrically to electrodes of each semiconductor IC element of the semiconductor wafer.

Furthermore, the present invention provides a method of manufacturing a probe card for semiconductor IC test on one principal surface of which are formed a plurality of probe electrodes for causing, together, a plurality of semiconductor IC elements formed on a semiconductor wafer to conduct electrically and which has, in a peripheral portion thereof, a thin film sheet fixed to a support. In this method, the frame-like support to which the thin film sheet is fixed is fixed to a substrate having rigidity by giving a strain that generates a tensile strain in the thin film sheet, whereby positions of the plurality of probe electrodes of the thin film sheet are corrected to prescribed positions that connect electrically to electrodes of each semiconductor IC element of the semiconductor wafer.

The thin film sheet provided with the probe electrodes can be manufactured by performing at least fixing a multilayer base material having a conductor layer and an insulating elastic material layer on a front surface and a rear surface thereof to the frame-like support in a tensioned condition in a peripheral portion thereof, forming a hole reaching the conductor layer from the insulating elastic material layer side at a plurality of prescribed locations of the multilayer base material, forming a plurality of probe electrodes by arranging, at locations of each of the holes, a conductor material so as to conduct in the conductor layer, and forming a plurality of second electrodes that connect electrically to each of the plurality of probe electrodes by etching the conductor layer so as to leave behind the conductor layer at the location of each of the holes.

In fixing the thin film sheet to the frame-like support with tension, it is advisable to raise the temperature of the thin film sheet. The thermal expansion of the thin film sheet is substantially governed by the conductor layer and the frame-like support is formed from ceramics and the like and, therefore, the coefficient of thermal expansion of the frame-like support is smaller than each material of the thin film sheet. For this reason, by utilizing the elongation of the conductor layer caused by a temperature rise, the thin film layer is fixed to the support, with the whole thin film sheet kept in an elongated condition, and by returning the temperature to an original condition, the thin film sheet comes to a condition with tension.

When second electrodes are formed on the thus fixed thin film sheet by etching and removing the conductor layer as described above, the force that slightly strains the frame-like support by sticking the thin film sheets with tension is released by the removal of the conductor layer and this tension relief causes the frame-like support to return to its original condition, with the result that the rearrangement of the probe electrodes occurs. On that occasion, usually the return of the frame-like support does not occur isotropically and in the case of a ring-like support, the support becomes elliptic. Therefore, the tension of the thin film sheet stuck to the support changes, with the result that the probe electrodes to be rearranged in association with this deviate from expected positions.

In a case where the probe electrodes deviate from expected positions from this cause or even from other causes, it is possible to rearrange the probe electrodes in the expected positions by adopting an assembling method which is such that in the direction in which this deviation is corrected, the tension-changed portion is formed as described above or the thin film sheet is fixed to the substrate by being stretched, with the frame-like support positively given a strain.

It is preferred that the tension-changed portion of the thin film sheet be formed on a peripheral side outward from a region where the plurality of probe electrodes are formed, in a position before the place where the thin film sheet is fixed to the support. This is because it is ensured that the rearrangement of the bumps can occur continuously and in a gentle manner.

It is possible to form a portion where contraction under heat occurs or a portion where the modulus of elasticity decreases as the tension-changed portion.

In forming the portion where contraction under heat occurs, a material having properties of contraction under heat, for example, a polymeric material, such as polyimide resin, is selected as the material for this portion where contraction under heat occurs. And the temperature of the material is locally raised to the glass transition temperature of the material, whereby contraction under heat that is larger than that of other portions is caused to occur. This increases the tension and it becomes possible to rearrange the probe electrodes by stretching other portions.

In heating the thin film sheet to form the portion where contraction under heat occurs, it is desirable to control heating intensity (heat quantity and time) and heating position (place and range) by measuring the positions of the probe electrodes. Heating is performed until a correction to the desired condition is made while the effect of contraction under heat is being checked. Warm air, an electric heater, a laser or a halogen lamp can be used as a heat source. It is preferred that light be collected by an optical fiber when a halogen lamp is used. This is because only a necessary portion can be locally heated.

In order to form the portion where the modulus of elasticity decreases, a hole may be formed in the thin film sheet by use of a physical instrument. There are available a laser, a needle, a punch and the like as the physical instrument. When a laser is used, a heat resistant material is provided as a base of the thin film sheet. This is because the heat resistant material prevents damage to other members and the like on the transmission side. In order to form the portion where the modulus of elasticity decreases, the film thickness of the thin film sheet may be reduced by mechanical polishing or chemical etching.

The strain of the frame-like support should be generated in the plane direction of the thin film sheet, and the amount of strain that does not break the support itself should be a limit. For example, when a ceramics ring having a diameter of 300 mm is used as the support, an appropriate amount of strain is less than 100 μm. The strain of the frame-like support can be given by binding a desired location with tape. This tape may be removed after the fixing of the ring-like rigid body to the substrate.

The constituent features of present invention include also a position correcting apparatus for correcting positions of the plurality of probe electrodes of the thin film sheet to prescribed positions that connect electrically to electrodes of each semiconductor IC element of the semiconductor wafer, which comprises a stage for holding the semiconductor wafer and the thin film sheet fixed to a frame-like support, which is the same as the support or different therefrom, a recognition unit that recognizes any position of the semiconductor wafer and thin film sheet held by the stage, a heat source unit for applying heat to the thin film sheet and a heat quantity controller, a moving unit that moves at least either the stage or the heat source unit in order to arrange the thin film sheet to a heating position by the heat source unit and an X-Y-Z position controller, and an integrated controller that gives instructions for heating position and heating time to the X-Y-Z position controller and the heat quantity controller, on the basis of the amount of deviation from an electrode of a semiconductor IC element corresponding to the position of the probe electrode of the thin film sheet recognized by the recognition unit, so that a portion where local heat contraction occurs, which generates a tensile force, is formed in the thin film sheet.

DESCRIPTION OF THE EMBODIMENTS

Embodiments of the present invention will be described below with reference to the drawings. Because the probe card related to the present invention basically has the same construction and manufacturing method as the conventional probe card which was described earlier with reference to FIGS. 13 and 14(A) to 14(F), the description will be given by using FIGS. 13 and 14(A) to 14(F).

Figure 13:
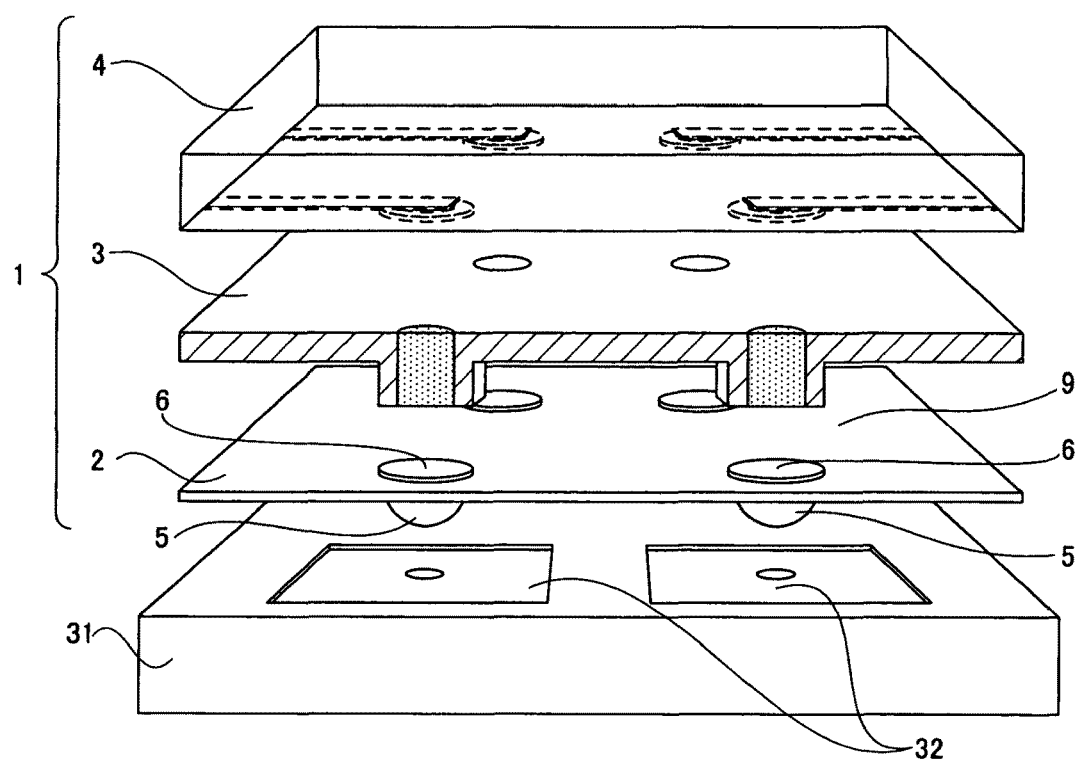
FIG. 13 is a diagram that shows the construction of a conventional probe card.

In FIG. 13, a semiconductor wafer 31 has a plurality of pad electrodes (hereinafter referred to simply as electrodes) 32. A probe card 1 is constituted by a contact sheet 2, a localized anisotropic conducting rubber 3 and a glass substrate 4. The glass substrate 4 is provided with electrodes for supplying a power supply and signals for inspection on one principal surface thereof and has rigidity.

The contact sheet 2 is such that on one surface thereof are formed a plurality of bump electrodes 5 as probe electrodes for coming into simultaneous contact with the plurality of electrodes 32 on the semiconductor wafer 31 together and on the rear surface side thereof are formed isolated-pattern electrodes 6 so as to form pairs with each of the bump electrodes 5. And the contact sheet 2 is fixed to a ring-like support, such as a ceramics ring 7 (preferably made of a material having a coefficient of thermal expansion on the order of not more than 3 to 4 ppm/° C., such as SiN and SiC) to be integrated with the glass substrate 4. Each of the isolated-pattern electrodes 6 directly connects electrically to the bump electrodes 5, and is connected to the electrodes of the glass substrate 4 via the localized anisotropic conducting rubber 3. However, the isolated-pattern electrodes 6 may be connected directly to the electrodes of the glass substrate 1 without the interposition of the localized anisotropic conducting rubber 3.

Figure 14A:
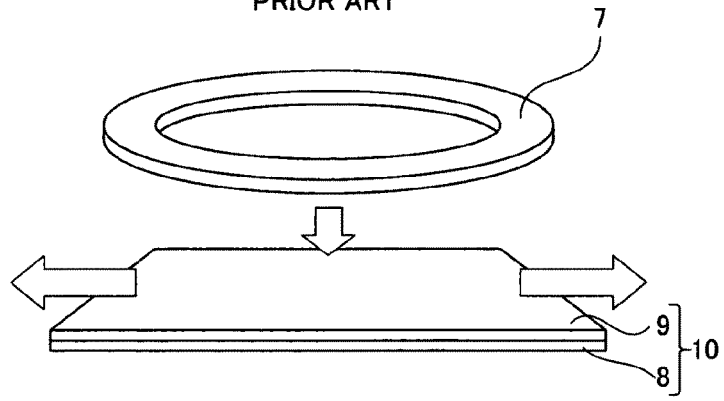
FIGS. 14A to 14F are diagrams that show the manufacturing process of a contact sheet within the probe card of FIG. 13.
Figure 14B:
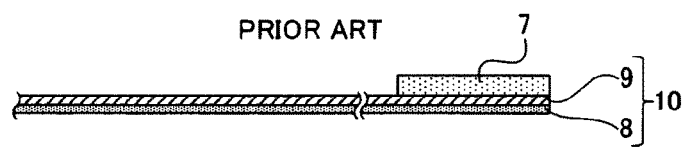

In manufacturing the contact sheet 2, as shown in FIGS. 14(A) and 14(B), the peripheral portion of a two-layer base material 10 having a metal conductor layer, such as a Cu layer 8, and an insulating elastic material layer, such as a polyimide layer 9, on the front and rear sides thereof, is stuck to the ceramics ring 7 having a inner circumference larger than the semiconductor wafer 31 (a base material of three or more layers in which an adhesive material and the like are interposed may also be used). On that occasion, the two-layer base material 10 is caused to expand thermally by being heated to the order of 200° C.

Figure 14C:
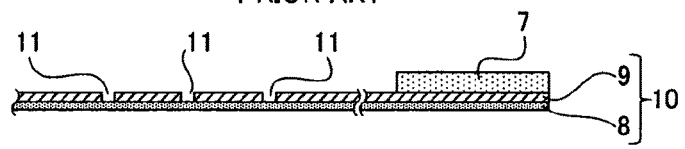
Figure 14D:
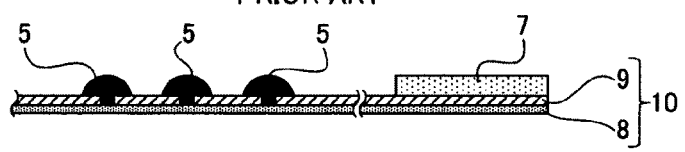
Figure 14E:
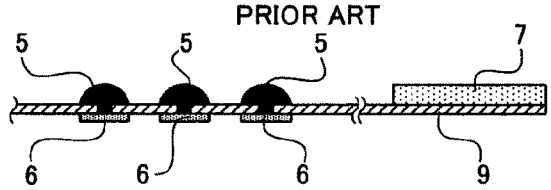

Next, as shown in FIG. 14(C), holes 11 that reach the Cu layer 8 from the polyimide layer 9 side are formed by a laser at a plurality of prescribed locations of the two-layer base material 10, as shown in FIG. 14(D), bump electrodes 5 are formed by coating growth at the locations of the holes 11, and as shown in FIG. 14E, the Cu layer 8 is removed by etching and left behind in regions serving as isolated-pattern electrodes 6.

Figure 14F:
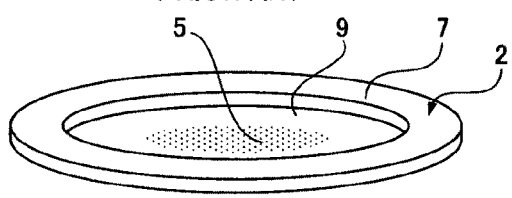

FIG. 14F shows a completed contact sheet 2. In this contact sheet 2, the bump electrodes 5 and the isolated-pattern electrodes 6 (refer to FIG. 14E) are formed on the front and rear sides of the polyimide layer 9 (hereinafter referred to as the thin film sheet 9). The peripheral portion of the contact sheet 2 (the thin film sheet 9 with bumps) is fixed to the ceramics ring 7. Because the two-layer base material 10 was caused to expand thermally in sticking thereof to the ceramics ring 7, the thin film sheet 9 with bumps is fixed in a condition with tension.

The point in which the probe card 1 of the present invention differs from the conventional probe card will be described by referring mainly to the contact sheet 2 shown in FIG. 1. This contact sheet 2 is such that in part of the thin film sheet 9, there is formed a region 12 in which the tension is different from that of other parts (hereinafter referred to as a tension-changed portion 12) in a region 9B (hereinafter referred to as a peripheral region 9B) on the peripheral side outward from a bump-formed region 9A, and the contact sheet 2 is fixed to the ceramics ring 7 in a condition in which a tensile strain is generated. As a result of this, the positions of the above-described plurality of bump electrodes 5 are corrected to prescribed positions that connect electrically to the electrode 32 of each of the semiconductor IC elements of the semiconductor wafer 31.

Incidentally, in this specification "tension" refers to stresses acting so as to mutually stretch any section within an object perpendicular to the section. "Tensile strain" refers to a change in shape or volume that occurs when an external force (based on a nonuniform tension) is applied to an object. In the above-described contact sheet 2, by working the thin film sheet 9 stuck to the ceramics ring 7 (in a condition in which tension is kept uniform) by some means, the balance of tension is partially tipped (the tension-changed portion 12 is formed) and a tensile strain (a shape change) is caused, whereby the bump electrodes 5 are moved to desired positions by using the phenomenon that the thin film sheet 9 will come to a condition of uniform tension again on that occasion.

Figure 2A:
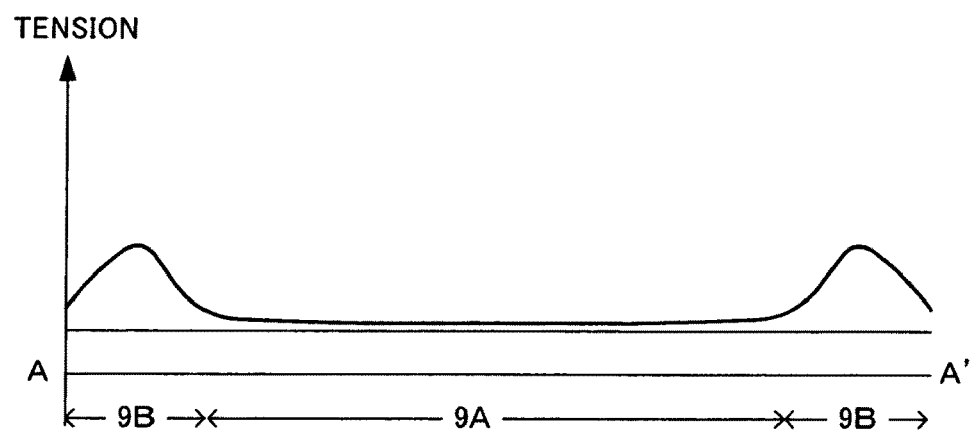
FIGS. 2A and 2B are diagrams that show the correlation between in-plane tension distribution and displacement of the contact sheet of FIG. 1.
Figure 2B:
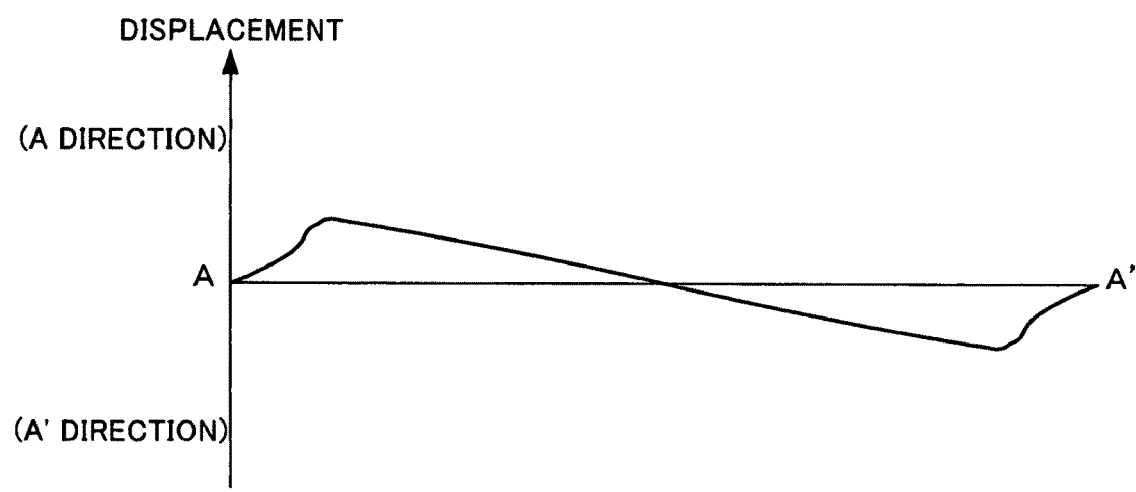

The following description will be given by using FIGS. 2A and 2B. FIG. 2A shows the tension in each position of the thin film sheet 9 in the direction of the straight line A-A' when the tension of the above-described tension-changed portion 12 is made larger than in other portions. FIG. 2B shows the direction of the movement of the bump electrodes 5 that occurs due to a change in this local tensile strain (i.e., the direction of displacement in each position of the thin film sheet 9) and the amount of the displacement. By locally increasing the tension of the thin film sheet 9 like this, the bump electrodes 5 on the thin film sheet 9 are rearranged in the direction in which the tension of the whole thin film sheet 9 becomes uniform. In this case, the tension is increased in the tension-changed portion 12 in the peripheral region 9B and, therefore, rearrangement is performed in such a manner that the bump electrodes 5 on the A-A' line (and near this line) move to the peripheral side of the thin film sheet 9.

The rearrangement of the bump electrodes 5 occurs also when conversely, the tension of the thin film sheet 9 is locally reduced. When the tension of the above-described tension-changed portion 12 is reduced, rearrangement occurs in such a manner that the bump electrodes 5 on the A-A' line (and near this line) move to the middle side of the thin film sheet 9.

Changing the tension in the peripheral region 9B like this is characterized by causing relatively uniform rearrangement. Therefore, this is effective in correcting a positional deviation which is gentle as a whole, and not a steep positional deviation. Complex rearrangement can be realized by locally changing the tension within the bump-formed region 9A. This effect increases particularly by making the region where the tension is changed narrow and steep.

Polymeric materials such as polyimide used in the thin film sheet 9 contract under heat when they are heated to temperatures in the neighborhood of their glass transition temperatures. Therefore, in causing a local tension change to occur, by taking advantage of this characteristic of polymeric materials, a tensile strain can be generated by heat in a desired portion.

Figure 3:
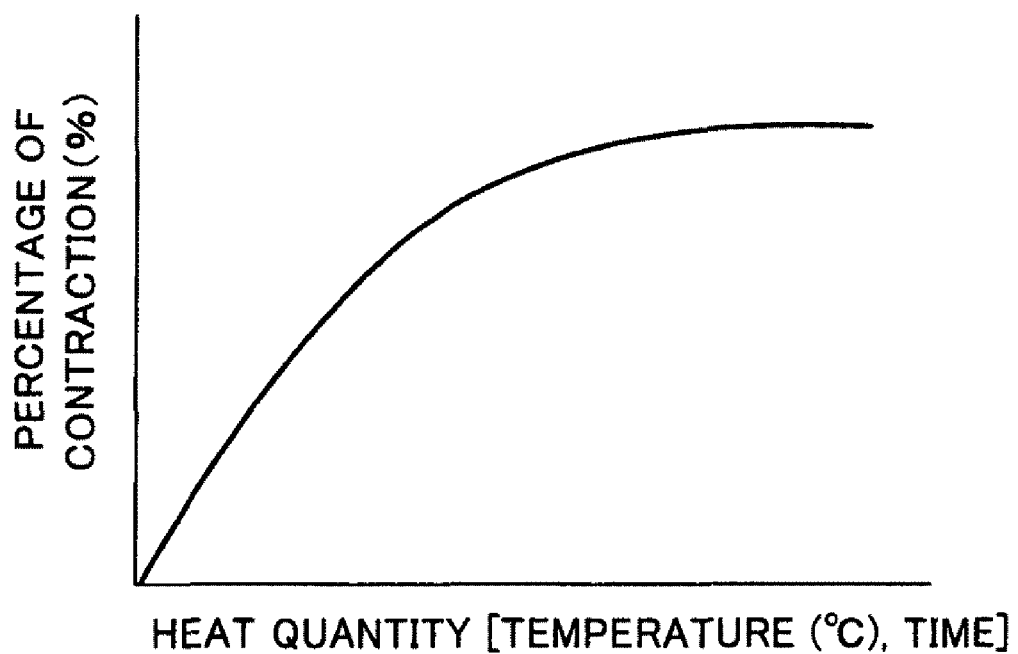
FIG. 3 is a thermal contraction characteristic diagram of a polymeric material used in the invention and conventional contact sheets.

FIG. 3 is a thermal contraction characteristic diagram. In a sheet formed from a polymeric material, while the heat quantity (determined by heating temperature and time) that is applied is within a certain range, the percentage of contraction increases with increasing heat quantity, and the percentage of contraction becomes saturated when this range is exceeded. When the heat quantity per unit time is constant, a similar characteristic diagram is obtained even when the diagram is prepared so that the abscissa indicates time. By taking advantage of this characteristic, a heat quantity within a range where the percentage of contraction depends on the heat quantity (preferably the percentage of contraction is proportional to the heat quantity) is selected and a percentage of contraction corresponding to this heat quantity is grasped beforehand, whereby it is possible to predict and select a correction amount (a distance to be covered). In the case of a polyimide, thermal contraction of the order of 0.45% occurs when heating at 350° C. for 10 minutes or so is performed.

Figure 1:
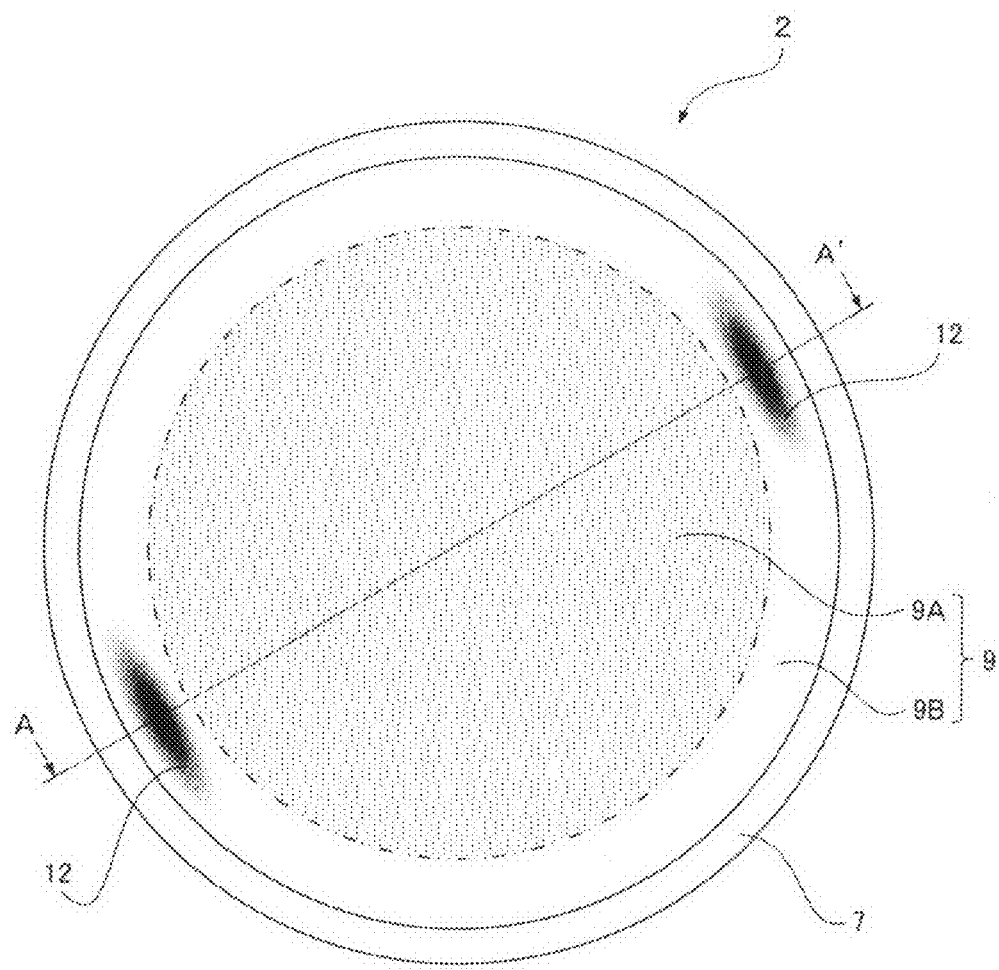
FIG. 1 is a plan view that shows the schematic construction of a contact sheet within a probe card in one embodiment of the present invention.

Incidentally, FIG. 1 above shows how thermal contraction is caused in the tension-changed portion 12 by concentrating warm air on a necessary area by throttling the warm air through a stainless steel nozzle. The warm air is blown to a relatively wide area although it is throttled by the nozzle, and the tensile strain changes continuously in the tension-changed portion 12 as indicated by light and shade. An aimed-at correction can be made more accurately by performing heating control, which involves adjusting the temperature, place, time and the like of heating, while monitoring (measuring) the positions of bumps in the vicinity of a location to be contracted under heat through a camera or the like. Local changes in tension can be caused also by chemicals and mechanical working.

A method of generating a local tensile strain will be more concretely described below.

Figure 4:
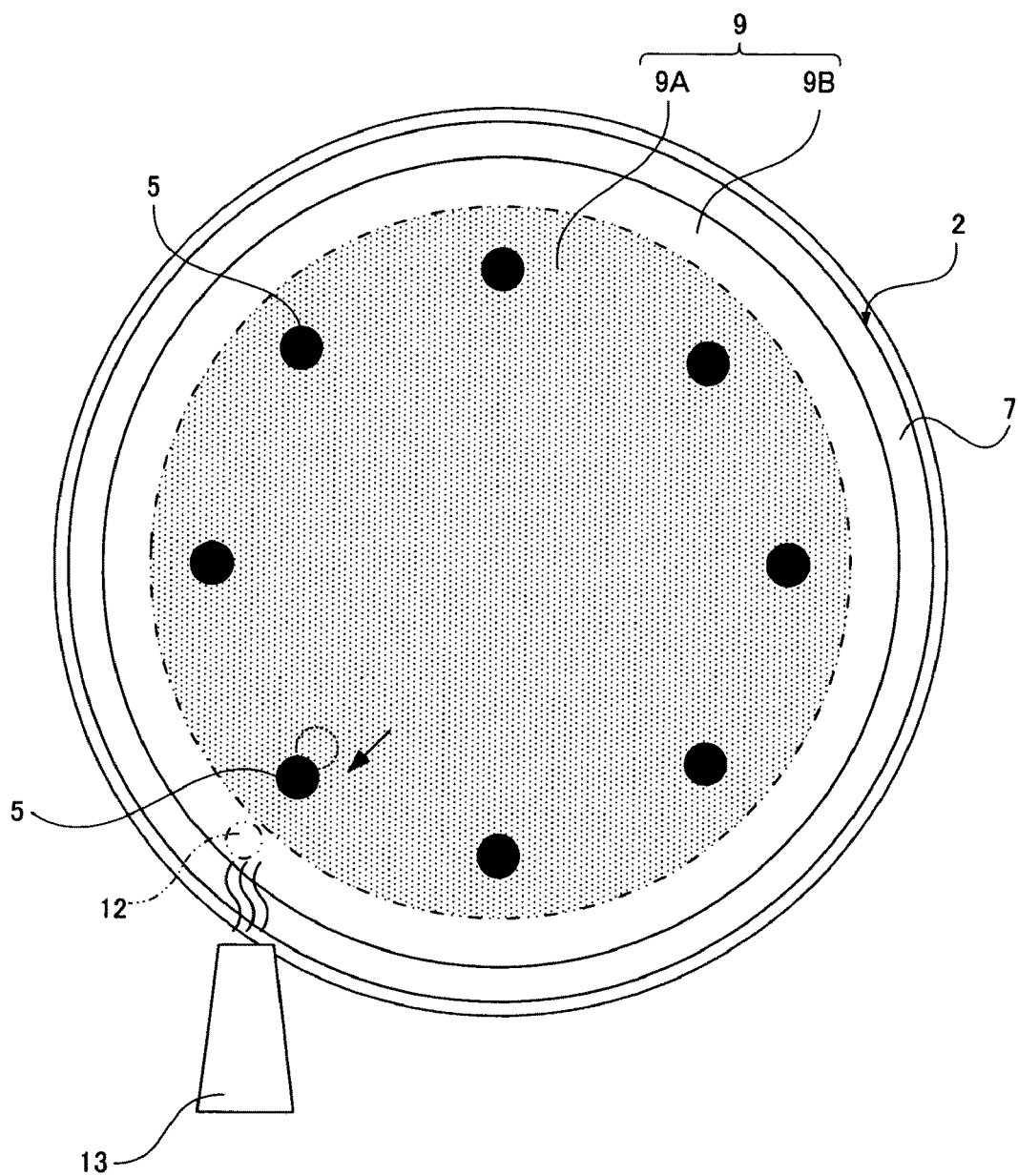
FIG. 4 is a plan view to explain a first method of the present invention for correcting the positions of probe electrodes of a contact sheet.

FIG. 4 is a conceptual diagram that shows a method of making positional corrections using bump electrodes 5 for positioning generally provided in the contact sheet 2 as an index. The bump electrodes 5 for positioning are provided for positioning with respect to a semiconductor wafer, and in this example, the bump electrodes 5 for positioning are formed at eight locations on the thin film sheet 9. The thin film sheet 9 is stuck to the ceramics ring 7 with a tension of not less than a given level as a whole.

When a bump electrode 5 for positioning is present on a broken line deviating from the prescribed position as shown in the figure, the vicinity of the bump electrode 5 in the peripheral region 9B is heated by warm air from a heat source 13, whereby thermal contraction is caused to occur in the thin film sheet 9 (the tension-changed portion 12) and it is possible to move the bump electrode 5 to the prescribed position in the direction in which the bump electrode 5 approaches the heated area.

Figure 5:
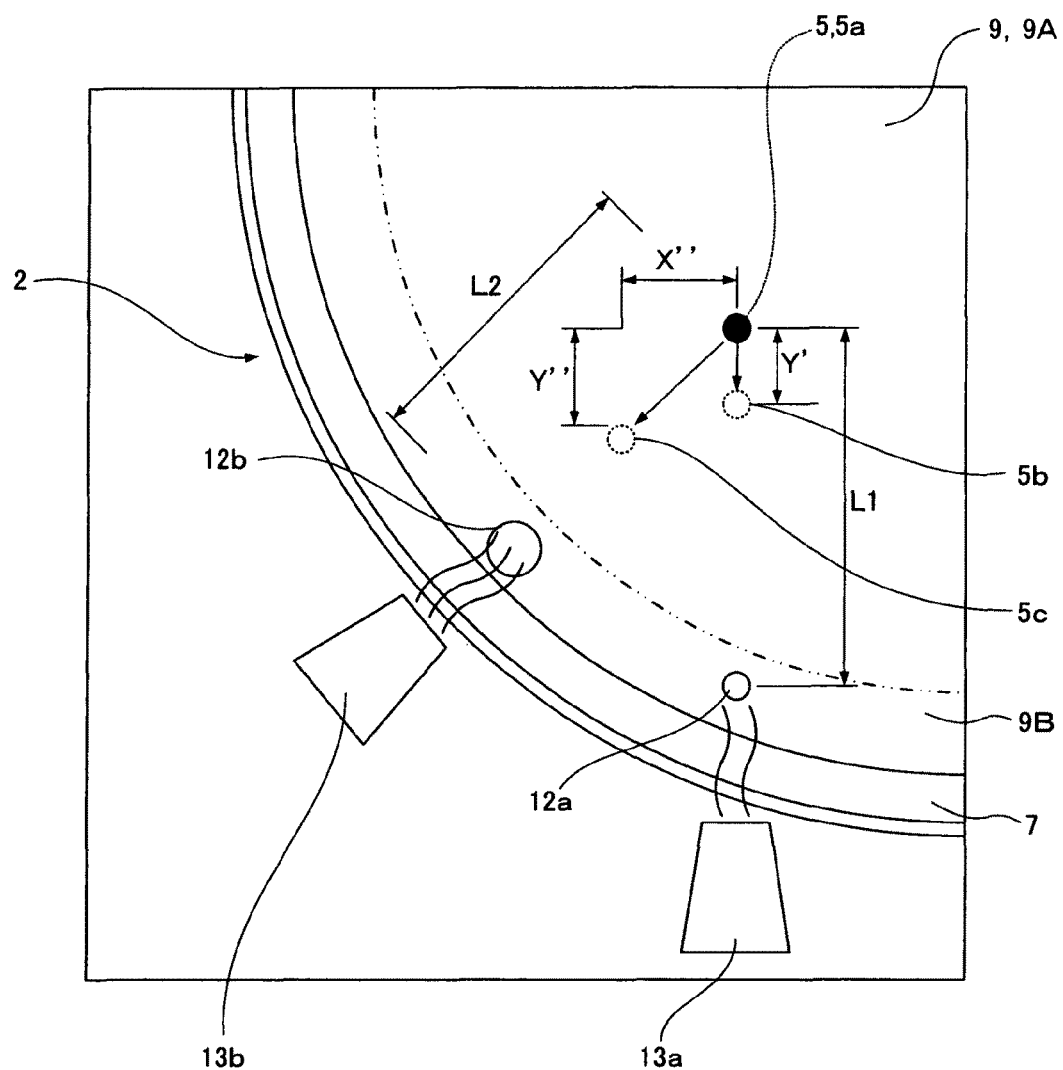
FIG. 5 is a conceptual diagram to further explain the position correcting method of FIG. 4.

This will be described in detail. In FIG. 5, when a positional correction of the bump electrode 5 on the thin film sheet 9 is to be made from a position 5a to a position 5b by the distance to be covered Y', a region 12a to be heated on a straight line connecting the original position 5a and the destination position 5b is heated by a heat source 13a. On that occasion, by performing the heating control of the heat source 13a while recognizing the distance covered by the bump electrode 5, it is possible to make a positional correction to the position 5b on the coordinate of the distance to be covered Y' with good accuracy.

When a positional correction of the bump electrode 5 is to be made from the position 5a to a position 5c by the distances to be covered X" and Y", a region 12b to be heated on a straight line connecting the original position 5a and the destination position 5c is heated by a heat source 13b. Also on this occasion, by performing the heating control of the heat source 13b while recognizing the distance covered by the bump electrode 5, it is possible to make a positional correction to the position 5c on the coordinate of the distances to be covered X" and Y" with good accuracy.

Although the above description was given of a case where warm air is used as the heat source, it is also effective to use a heater. If a heater like a soldering iron whose leading end is flattened to the order of 5 mmϕ, the temperature distribution in the plane direction becomes steep compared to the case where warm air is used and it is possible to give a steep tensile strain, in other words, a step-like tensile strain. The use of laser light as the heat source is also good and this enables finer local thermal contraction to be caused. Better results are obtained by applying a material having a high laser light absorption coefficient beforehand in order to convert laser light into heat with a good efficiency.

It is also effective to use a light source, such as a halogen lamp, as the heat source. In order to cause thermal contraction in a prescribed place with good efficiency, it is also advisable to throttle the heat by use of an optical fiber and the like. Also simple is a method which involves applying a material having a good light absorption coefficient only to a part where thermal contraction is to be caused and giving light having a certain level of intensity to the whole surface.

In all of these heat sources, it is desirable to arrange a material having excellent heat resistance and a high heat insulating effect on the rear surface side of the thin film sheet 9 from the standpoints of causing efficient thermal contraction and protecting the rear surface side.

Figure 6:
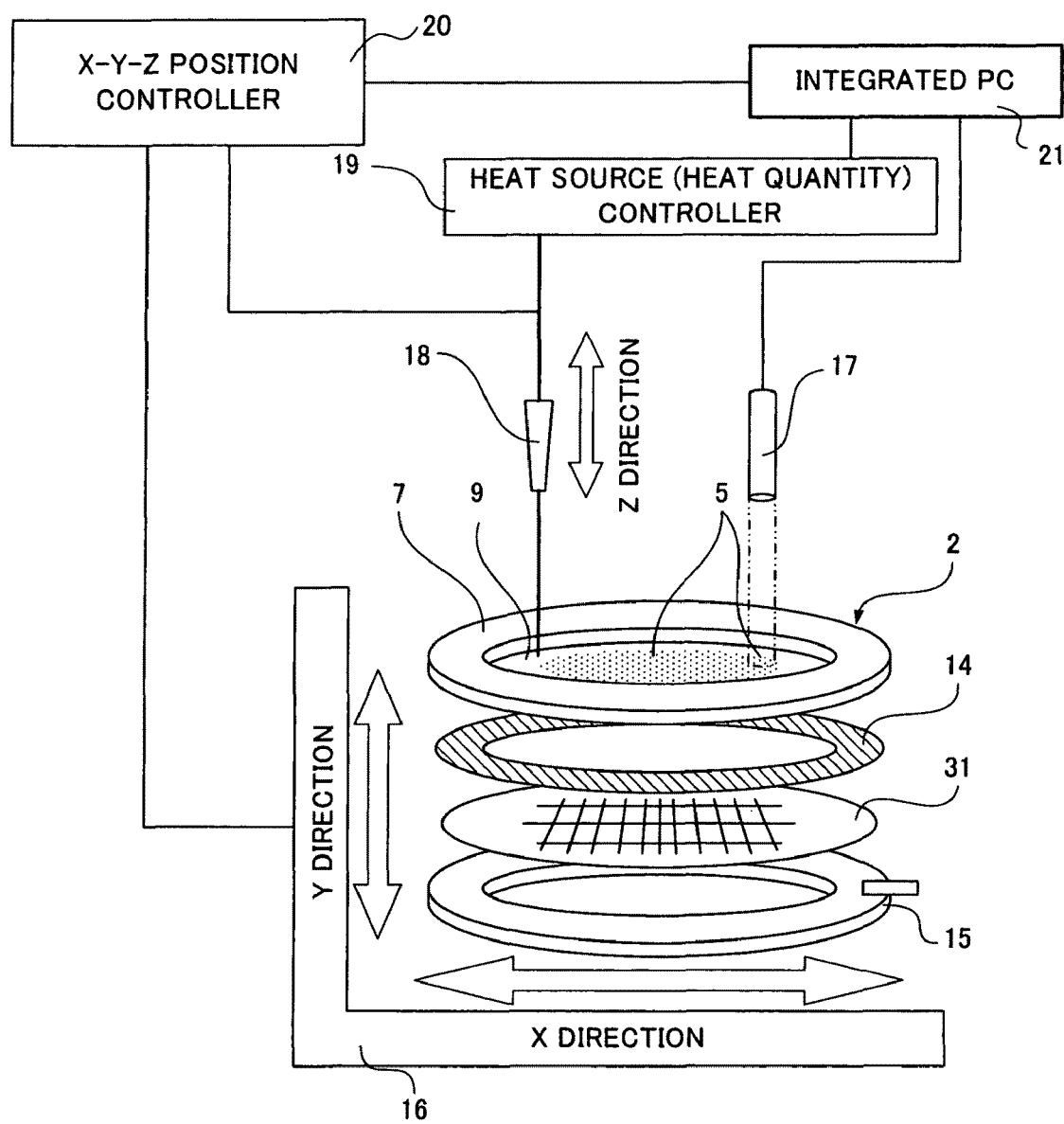
FIG. 6 is a block diagram of a position correcting device of the present invention.

FIG. 6 shows the construction of a position correcting device. As described above, the contact sheet 2 is such that the plurality of bump electrodes 5 and isolated-pattern electrodes (not shown) that form pairs with the bump electrodes 5 are formed on the transparent thin film sheet 9, and the contact sheet 2 is fixed to the ceramics ring 7 in the peripheral portion of the tin film sheet 9.

Reference numeral 14 denotes a ring-like sticking preventing plate arranged between the contact sheet 2 and the semiconductor wafer 31. Reference numeral 15 denotes a wafer tray made of aluminum, which integrally holds the semiconductor wafer 31, the sticking preventing plate 14 and the contact sheet 2.

Reference numeral 16 denotes an X-Y table that moves the wafer tray 15 in the X direction and the Y direction, and reference numeral 17 denotes a recognition camera for recognizing, from above, any position of the semiconductor wafer 31 and the contact sheet 2 held by the wafer tray 15. Reference numeral 18 denotes a heat source unit for applying heat to the tin film sheet 9, which is provided with a vertical movement mechanism (in the Z direction), and reference numeral 19 denotes a heat quantity controller that controls the heat quantity applied by use of the heat source unit 18. Reference numeral 20 denotes an X-Y-Z position controller that moves the X-Y table 16 and the heat source unit 18 in order to arrange the thin film sheet 9 to a heating position by the heat source unit 18, and reference numeral 21 denotes an integrated PC that performs image processing for the recognition camera and integrated control.

When the wafer tray 15 integrally holding the semiconductor wafer 31, the sticking preventing plate 14 and the contact sheet 2 is placed on the X-Y table 16, this wafer tray 15 is automatically moved by the X-Y-Z position controller 20 and the X-Y table 16 under instructions from the integrated PC 21 to the heating area by the heat source unit 18.

And bump electrodes 5 for positioning, for example, on the contact sheet 2 and electrodes of the semiconductor wafer 31 corresponding to these bump electrodes 5 for positioning are monitored at a time from above by the recognition camera 17, and after image processing, the amount of deviation of the positions of the bump electrodes 5 for positioning is found on the basis of the positions of the electrodes of the semiconductor wafer 31.

And the feedback control of heating position (place and range) and heating intensity (heating temperature and heating time) is performed for the X-Y-Z position controller 20 and the heat quantity controller 19 so that the deviation is eliminated. In this state, the above-described local portion where contraction under heat occurs is formed in the thin film sheet 9 and a tensile stress is generated, whereby the bump electrodes 5 for positioning and the bump electrodes 5 in the vicinity thereof are rearranged in appropriate positions. The sticking of the semiconductor wafer 31 is prevented by the sticking preventing plate 14.

Incidentally, at the start of monitoring by the recognition camera 17, first, the positions of the bump electrodes 5 for positioning on the whole surface of the thin film sheet 9 is observed. And in a case where there are a plurality of bump electrodes 5 that require a positional correction and these bump electrodes 5 are close to each other, a tensile strain is caused to occur in a position considered best suited in consideration of the relative positions of each of the bump electrodes 5.

For example, when the correction of a bump electrode having the largest correction amount (hereinafter referred to as the first bump electrode to be corrected) is made first, the moving direction in which the other bump electrode (hereinafter referred to as the second bump electrode to be corrected) moves is predicted. On that basis, the correction of the first bump electrode to be corrected is made by taking into consideration the distance covered by the second bump electrode to be corrected, and when the second bump electrode to be corrected is subsequently corrected, this correction is made by taking into consideration the direction in which the first bump electrode to be corrected itself moves and the distance covered by the first bump electrode to be corrected. After that, the correction of the second bump electrode to be corrected is made so that the bumps in their respective positions come to optimum positions.

As a matter of course, both of the contact sheet 2 and the semiconductor wafer 31 may be observed separately by a single recognition camera 17 or a plurality of recognition cameras 17 and superimposed on an image instead of being observed at a time by a single recognition camera as described above.

It is advisable that the contact sheet 2 fixed to the ceramics ring 7 be worked singly as shown in the drawing, that is, without being integrated with the substrate 4. When it is necessary to perform working above the substrate 4, a light shielding and heat insulating sheet are installed so that damage by laser light and the like is not caused to the substrate 4.

Next, a description will be given of a method of performing the rearrangement of the bump electrodes 5 by generating a tensile strain in the thin film sheet 9, which involves not increasing part of the tension of the thin film sheet 9, but conversely, relieving part of the tension as described above.

Figure 7:
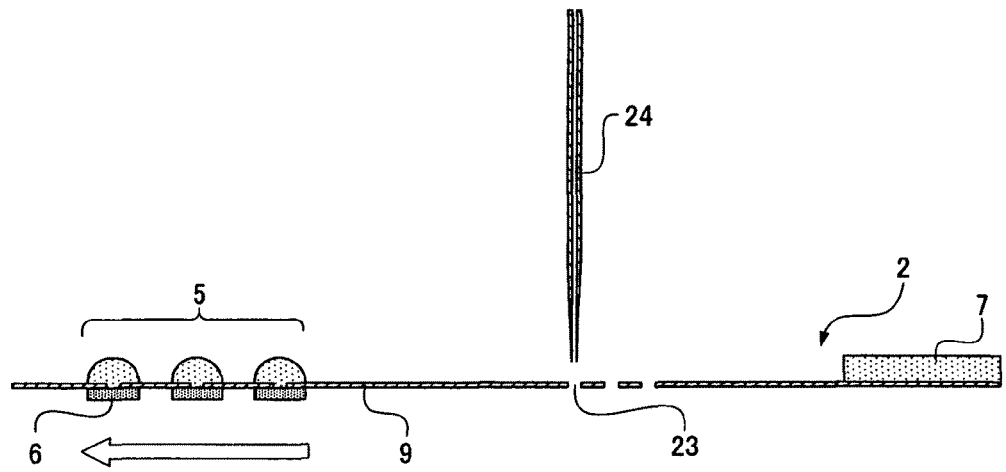
FIG. 7 is a plan view to explain a second method of the present invention for correcting the positions of probe electrodes of a contact sheet.

In a contact sheet 2 shown in FIG. 7, it is supposed that bump electrodes 5 on a thin film sheet 9 whose peripheral portion is fixed to a ceramics ting 7 are fabricated on the side rightward from their original design positions. The thin film sheet 9 is stuck, originally with tension present overall.

In such a case, a hole 23 is made in the thin film sheet 9 by use of a needle 24 as shown in the figure, whereby the tension is relieved and the thin film sheet 9 is moved to the left side as indicated by the arrow. When with respect to the bump electrodes 5 whose positions are to be corrected, a hole 23 is made on the side reverse to the direction in which the bump electrodes 5 are to be moved, the tension in this part decreases and this part stretches (an apparent decrease in the modulus of elasticity), with the result that the bump electrodes 5 move in the direction reverse to the hole 23.

The number and size of the holes 23 can be arbitrarily adjusted according to a necessary correction amount and the bumps 5 can be gradually moved by forming the holes 23 little by little at a plurality of times. In this technique, working is simple and easy, the amount of tensile strain can also be adjusted, and a correction in the center direction can be easily made by working the peripheral region of the tin film sheet 9.

It is not always necessary that the shape of the hole 23 be circular. However, because the hole is made in the thin film sheet 9 having tension, breakage occurring from a corner as an initiation point is less apt to occur in a smooth shape and the application of hole making by the needle 24 to a thin film sheet of larger tension becomes possible. It can be said that a perfect circle and shapes near a perfect circle are desirable.

It is preferred that the needle 24 have a needlepoint of 0.3 mm to 3 mm or so, and a dispenser needle, an injection needle and the like are used by pointing the leading end. As a result of this, a hole 23 that is a perfect circle or has a shape near perfect circle is formed. In a simple way, the needle 24 is fixed to the rotary part of a rotary jig, such as a drill, and the leading end of the needle 24 is shaved with a file and the like. It is better that the surface of the needlepoint be smoothed by chemical etching.

Excimer or carbon dioxide laser light (not shown) may also be used in place of the needle 24. By means of laser light, the thin film sheet 9 becomes melted and the hole 23 is formed. Therefore, the shape of the hole 23 is smooth and the breakage of the thin film sheet 9 with the hole 23 as an initiation point is less apt to occur than when the needle 24 is used.

As another method for relieving the tension of the thin film sheet 9, there is available a method by which part of the thin film sheet 9 is mechanically polished to reduce the thickness.

Figure 8:
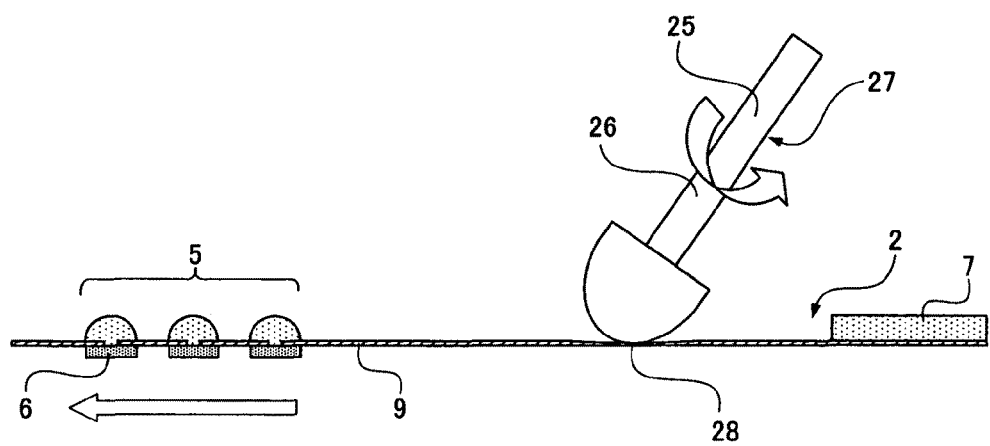
FIG. 8 is a plan view to explain a third method of the present invention for correcting the positions of probe electrodes of a contact sheet.

In a contact sheet 2 shown in FIG. 8, in the same way as described above with reference to FIG. 7, it is supposed that bump electrodes 5 on a thin film sheet 9 whose peripheral portion is fixed to a ceramics ting 7 are fabricated on the side rightward from their original design positions.

Also in this case, with respect to the bump electrodes 5 whose positions are to be corrected, the side reverse to the direction in which the bump electrodes 5 are to be moved is worked. A portion 28 whose tension is to be relieved is polished to reduce the thickness of this portion by use of a mechanical polishing file 27 in which a file 26 is attached to the leading end of a rotating shaft 25. The tension of the thinned portion 28 decreases and this portion 28 stretches, with the result that the bump electrodes 5 move in the direction reverse to this portion 28.

Figure 9:
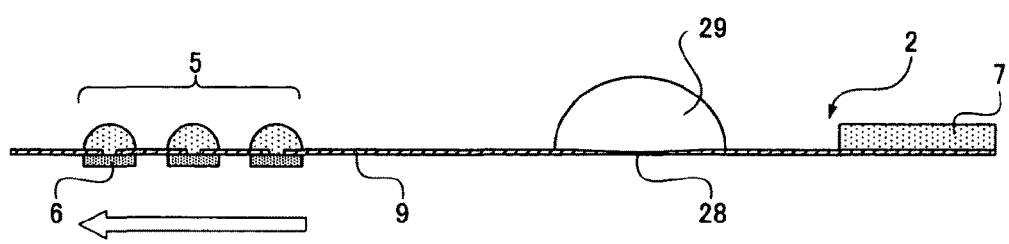
FIG. 9 is a plan view to explain a fourth method of the present invention for correcting the positions of probe electrodes of a contact sheet.

As a further method for relieving the tension of the thin film sheet 9, there is available a method by which part of the thin film sheet 9 is chemically etched to reduce the thickness. In a contact sheet 2 shown in FIG. 9, in the same way as described above with reference to FIG. 7, it is supposed that bump electrodes 5 on a thin film sheet 9 whose peripheral portion is fixed to a ceramics ting 7 are fabricated on the side rightward from their original design positions.

Also in this case, with respect to the bump electrodes 5 whose positions are to be corrected, the side reverse to the direction in which the bump electrodes 5 are to be moved is worked. A portion 28 whose tension is to be relieved is thinned by supplying an etchant 29 thereto by use of a method, such as dripping and application, and washing away the etchant 29 with a large volume of water and the like at an appropriate point of time. The tension of the thinned portion 28 decreases and this portion 28 stretches, with the result that the bump electrodes 5 move in the direction reverse to this portion 28. The etching rate can be adjusted by the amount and degree of dilution of the etchant 29 and also by the temperature, etc. of the etchant 29.

Figure 10:
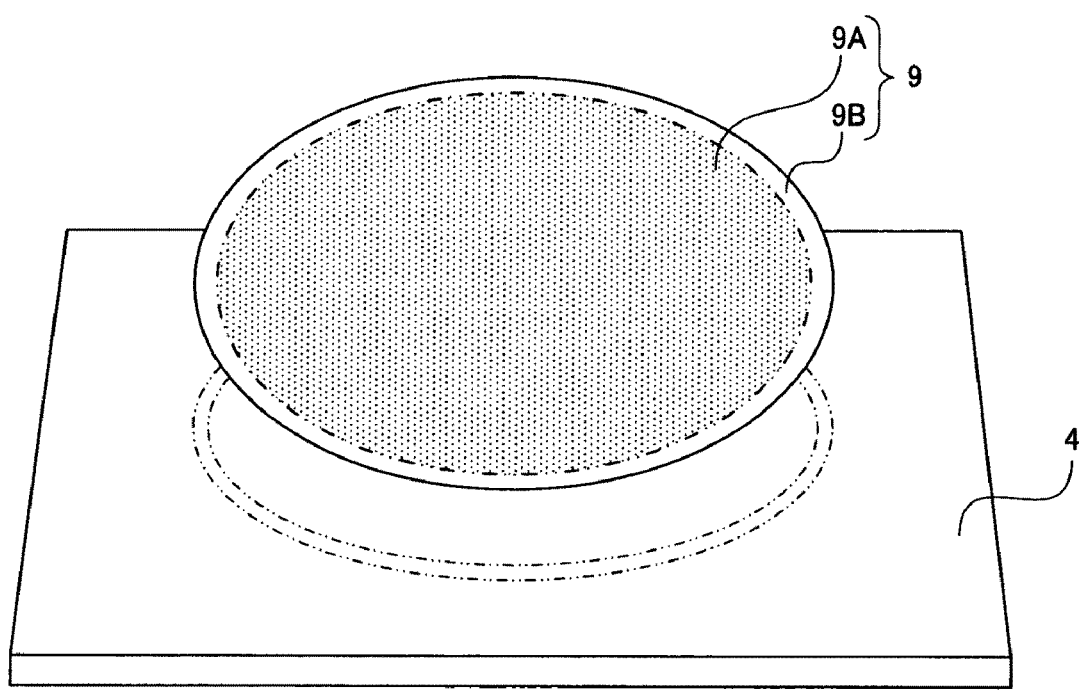
FIG. 10 is an exploded perspective view that shows the schematic construction of a probe card in another embodiment of the present invention.

Incidentally, the above description was given on the assumption that the positions of the bump electrodes 5 on the thin film sheet 9 fixed to the ceramics ring 7 are corrected and that this ceramics ring 7 is fixed to the substrate. However, the present invention is not limited to this case. It is also possible to use a frame-like support similar to the ceramics ring 7 as a jig for correcting the positions of the bump electrodes 5 instead of fixing the ceramics ring 7 to the substrate. In this case, as shown in FIG. 10, only a thin film sheet 9 fixed to a jig (not shown), for which a position correction has already been made, is stuck onto a sticking position (a ring-like area indicated by imaginary lines) of a substrate 4 and the jig is then removed.

Figure 11A:
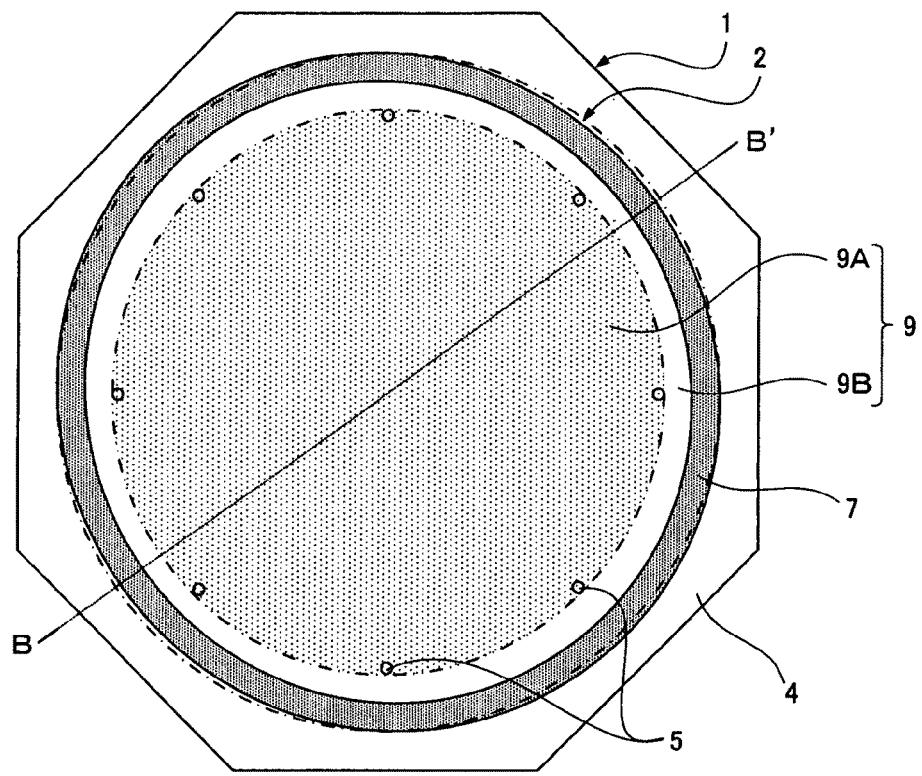
FIGS. 11A and 11B are plan views that show the schematic construction of a probe card in another embodiment of the present invention and explain a fifth method of the present invention for correcting the positions of probe electrodes.

As shown in FIG. 11A, a probe card 1 may be assembled by giving a strain to a ceramics ring 7 to which a contact sheet 2 is fixed. Also by this method, it is possible to correct the positions of bump electrodes 5 on a thin film sheet 9. The alternate long and short dash line in the figure indicates the position obtained when the ceramics ring 7 is assembled in its original elliptical shape. The ceramics ring 7 is in a condition in which a strain occurs in such a manner that, as indicated by the solid line, when a force is applied inward in a direction along the B-B' line, the ceramics ring 7 contracts in the B-B' direction and stretches in a direction orthogonal to the B-B' direction.

For example, in a case where an 8-inch wafer is to be burned in, on the assumption that a contact sheet 2 is fixed to a ceramics ring 7 made of SiC, 240 mm in outside shape, 222 mm in inside diameter and 2 mm in thickness, the degree of a strain in the outermost circumference is on the order of several micrometers to 100 μm when the force applied inward to the ceramics ring 7 is on the order of several to several tens of kilograms. Because ceramics develop cracks when an external pressure of not less than a certain level is given, a strain of less than 100 μm is appropriate.

In order to maintain the degree of a strain as high as possible, it is preferred that flaws and the like be removed beforehand by polishing the ceramics surface with fine grains. Furthermore, it is preferred that sharp flaws be removed beforehand by chemical etching and the like.

If the probe card 1 is assembled, simply with a strain given to the ceramics ring 7, then the ceramics ring 7 is deformed in the direction in which the strain is relieved and the ceramics ring 7 returns to its original condition. In order to prevent this, it is necessary that the ceramics ring 7 be fixed to the substrate 4 with an adhesive and the like or fixed onto the substrate 4 by use of a holding jig and the like. FIG. 11A shows the condition of the ceramics ring fixed with an adhesive.

Figure 11B:
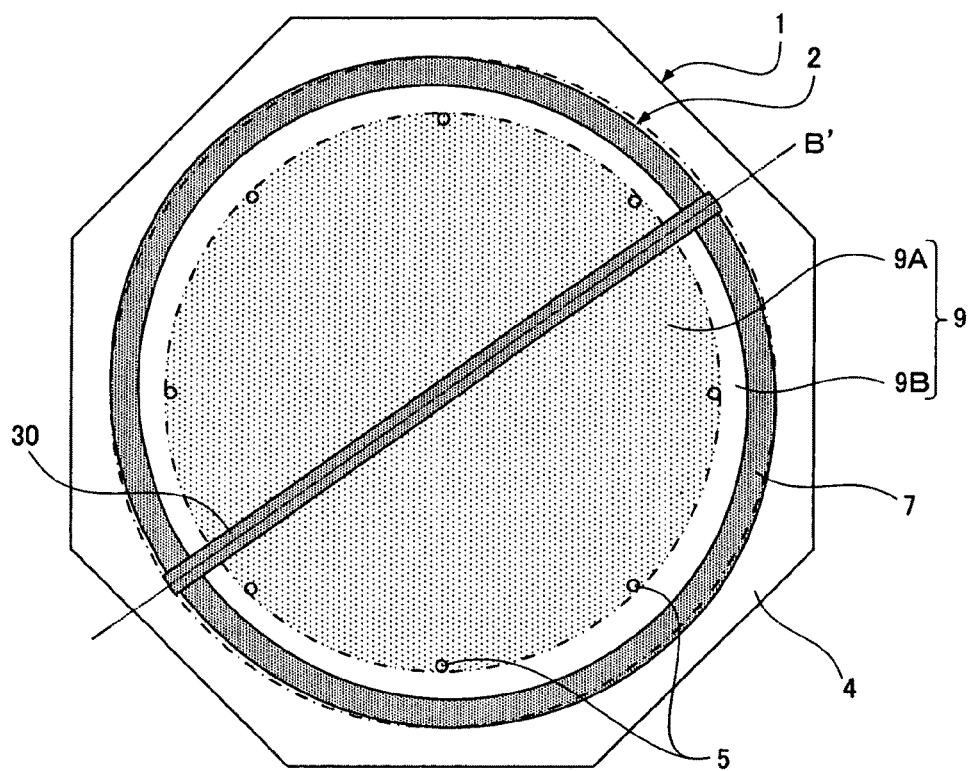

FIG. 11B shows a case where a strain is given to a ceramics ring 7 to which a contact sheet 2 is fixed, the shape of the ceramics ring is fixed with tape 30 and thereafter the ceramics ring 7 is fixed to a substrate 4. It is effective that at locations of both ends in the direction in which the ceramics ring 7 stretches most (in this case, the intersection points with B-B'), adhesive tape 30 having large tension, such as Capton tape, is stuck by being stretched so that the locations at the above-described two ends are drawn toward each other. The tape 30 may be removed after the completion of the fixing to the substrate 4.

An investigation was made into the effect of a case where a position correction is made by giving a strain to the ceramics ring 7 as described above. Concretely, in a contact sheet 2 (a ceramics ring 7 plus a thin film sheet 9 having bumps) of a probe card 1 corresponding to a 300-mm wafer, bump electrodes 5 at eight locations in the outermost circumference as shown in the figures were selected and the positions of the bumps before and after the correction were measured. These bump electrodes 5 at eight locations are provided at intervals of 45 degrees right and left, up and down and aslant on the basis of the design center corresponding to the wafer center.

Figure 12:
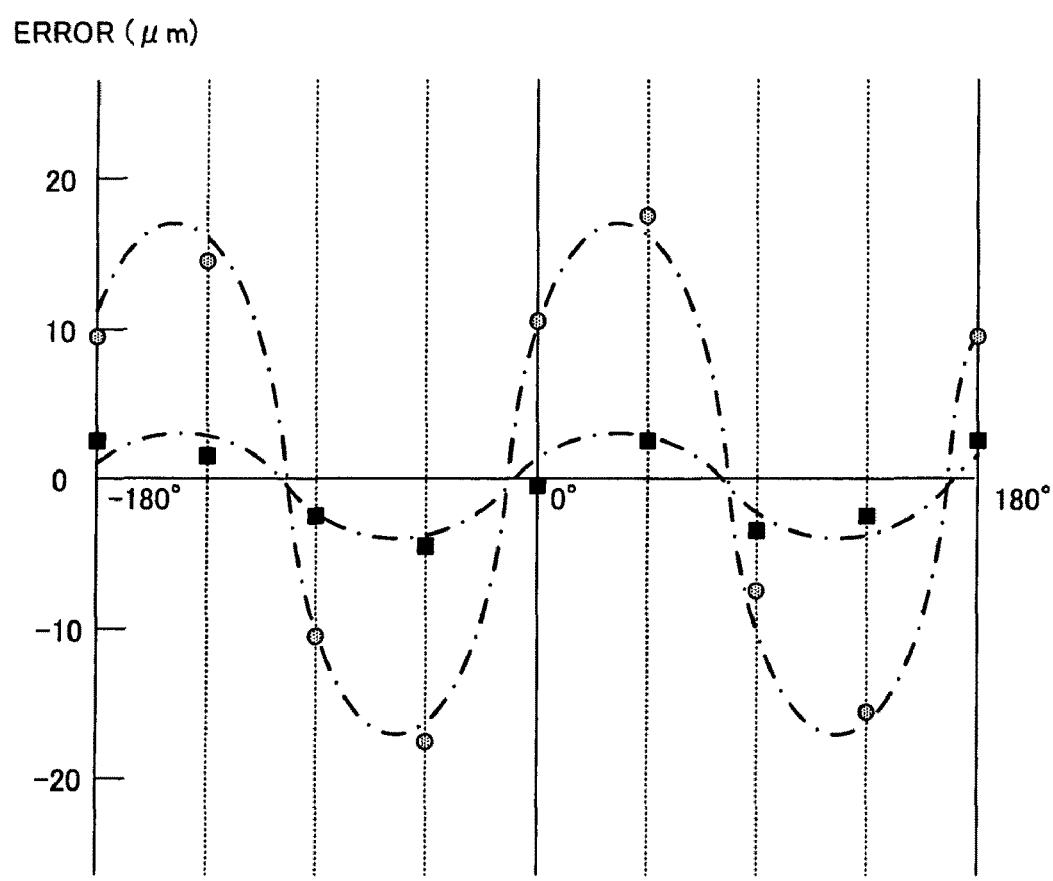
FIG. 12 is a diagram that shows the effect of the method of FIG. 11.

FIG. 12 shows measurement results. The ordinate indicates differences from the design distance (design value) corresponding to the distance (measured value) from the design center of the probe card 1. With the outward movement of the bump electrodes 5 expressed as plus and the inward movement as minus, measurement results before the correction were plotted with circles and measurement results after the correction were plotted with squares. The alternate long and short dash lines indicate sine curves fitted to each measuring point. It is apparent that measured values approach the design value after the position correction.

As described above, the probe card 1 and the method of manufacturing the card in the present invention correct the positions of the bump electrodes 5 by changing the tensile strain of the thin film sheet 9 positively and in a sustained manner and, therefore, it is possible to improve the position accuracy of the bump electrodes 5. And by using this probe card 1, it is possible to eliminate defective contact of the semiconductor wafer 31 with the electrodes 32 and the need to perform the reinspection caused by this defective contact.

Accordingly, it is possible to achieve the shortening of the inspection lead time and cost reductions and at the same time it is possible to realize stable wafer burn-in measurement, which leads to a quality improvement. The present invention is very effective in performing burn-in by connecting the probe card 1 to micro electrodes on a semiconductor wafer for which scale down designs are advancing.

The bump electrodes 5 were named as a representative example of a probe electrode, and needle-like or pyramid-like electrodes, for example, may be used. Also for the ceramics ring 7, it is possible to use frame-like supports (jigs) of a quadrangle, a polygon or other shapes that are made of ceramics or other materials.

The invention claimed is:

1. A probe card for semiconductor IC test comprising:
   a thin film sheet;
   a plurality of probe electrodes arranged on one principal surface of the thin film sheet;
   a support for fixing a peripheral portion of the thin film sheet; and
   a local tension-changed portion formed on the thin film sheet,
   wherein a shape or thickness of the thin film sheet is heat deformed in the local tension-changed portion, so that the plurality of probe electrodes are arranged respectively in prescribed positions where the probe electrodes can be electrically connected together to electrodes of a plurality of semiconductor IC elements formed on a semiconductor wafer.

2. The probe card for semiconductor IC test according to claim 1, wherein the tension-changed portion of the thin film sheet is formed on a peripheral side outward from a region where the plurality of probe electrodes are formed.

3. A probe card for semiconductor IC test according to claim 1, wherein the support is in ring form.

4. A method of manufacturing a probe card for semiconductor IC test comprising the steps of:
   fixing a peripheral portion of a thin film sheet to a support;
   forming a plurality of probe electrodes on one principal surface of the thin film sheet; and
   forming a local tension-changed portion in at least one location of the thin film sheet,
   wherein a shape or thickness of the thin film sheet is changed by forming the local tension-changed portion by a heat source, so that the plurality of probe electrodes are respectively arranged in prescribed positions where the probe electrodes can be electrically connected together to electrodes of a plurality of semiconductor IC elements formed on a semiconductor wafer.

5. A position correcting apparatus to be used in manufacturing a probe card for semiconductor IC test, the probe card comprising:
   a thin film sheet;
   a plurality of probe electrodes arranged on one principal surface of the thin film sheet;
   a support for fixing a peripheral portion of the thin film sheet; and
   a local tension-changed portion formed on the thin film sheet, and the position correcting apparatus comprising:
   a stage for holding a semiconductor wafer and the thin film sheet fixed to a frame-like support, which is the same as the support or different therefrom, a recognition unit that recognizes any position of the semiconductor wafer and thin film sheet held by the stage;
   a heat source unit for applying heat to the thin film sheet and a heat quantity controller;
   a moving unit that moves at least one of the stage and the heat source unit in order to arrange the thin film sheet in a heating position by the heat source unit and an X-Y-Z position controller; and
   an integrated controller that gives instructions for heating position and heating time to the X-Y-Z position controller and the heat quantity controller, on the basis of the amount of deviation from an electrode of a semiconductor IC element corresponding to the position of the probe electrode of the thin film sheet recognized by the recognition unit, so that a portion where local heat contraction occurs, which generates a tensile strain in the tension-changed portion, is formed in the thin film sheet, wherein the plurality of probe electrodes are respectively arranged in prescribed positions where the probe electrodes can be electrically connected together to electrodes of a plurality of semiconductor IC elements formed on the semiconductor wafer by forming the portion where heat contraction occurs.

6. A probe card for semiconductor IC test according to claim 1, wherein the shape or thickness of the thin film sheet is heat deformed in the local tension-changed portion by warm air.

7. A probe card for semiconductor IC test according to claim 1, wherein the shape or thickness of the thin film sheet is heat deformed in the local tension-changed portion by a heater like a soldering iron.

8. A probe card for semiconductor IC test according to claim 1, wherein the shape or thickness of the thin film sheet is heat deformed in the local tension-changed portion by laser light.

9. A method of manufacturing a probe card for semiconductor IC test according to claim 4, wherein the heat source is warm air.

10. A method of manufacturing a probe card for semiconductor IC test according to claim 4, wherein the heat source is a heater like a soldering iron.

11. A method of manufacturing a probe card for semiconductor IC test according to claim 4, wherein the heat source is laser light.

12. A position correcting apparatus to be used in manufacturing a probe card for semiconductor IC test according to claim 5, wherein a heat source of the heat source unit is warm air.

13. A position correcting apparatus to be used in manufacturing a probe card for semiconductor IC test according to claim 5, wherein a heat source of the heat source unit is a heater like a soldering iron.

14. A position correcting apparatus to be used in manufacturing a probe card for semiconductor IC test according to claim 5, wherein a heat source of the heat source unit is laser light.

* * * * *